(12) United States Patent
Sasaki et al.

(10) Patent No.: US 6,433,287 B1
(45) Date of Patent: Aug. 13, 2002

(54) CONNECTION STRUCTURE

(75) Inventors: Katsuhito Sasaki; Isao Kimura; Mamoru Ishikiriyama, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/612,462

(22) Filed: Jul. 7, 2000

(30) Foreign Application Priority Data

Jul. 22, 1999 (JP) .......................................... 11-207524

(51) Int. Cl.⁷ ................................................ H01R 9/09
(52) U.S. Cl. ......................... 174/262; 174/261; 29/852; 257/698; 438/637
(58) Field of Search ................................. 174/262, 261; 361/767, 771, 772; 438/20, 37, 38; 257/98, 773; 29/852

(56) References Cited

U.S. PATENT DOCUMENTS 5,372,666 A * 12/1994 Kawasaki ................ 156/89.15
6,001,415 A * 12/1999 Nogami et al. ............... 427/97
6,100,177 A *  8/2000 Noguchi ..................... 438/638

FOREIGN PATENT DOCUMENTS

JP          04096254 A  *  3/1992
JP          08125176         5/1996

* cited by examiner

*Primary Examiner*—Albert W. Paladini
(74) *Attorney, Agent, or Firm*—Rabin & Berdo, P.C.

(57) ABSTRACT

There is provided a connection structure in which concentration of current in a connection portion of wirings, or of an element and a wiring is prevented. Three slits are formed in each of a first wiring and a second wiring, which extends in a direction perpendicular to a direction in which the first wiring extends, so that distances from the side of a cross internal angle gradually become longer. A portion of a current path is changed by these slits so as to limit current which can flow through the cross internal angle.

9 Claims, 9 Drawing Sheets

CONNECTION STRUCTURE

BACKGROUND OF THE INVENTION

1. Field of the Invention

The present invention relates to a connection structure, and particularly to a connection structure of a contact portion in a conductive-member construction in which heavy current flows.

2. Description of the Related Art

In order to realize high integration of a semiconductor device such as IC or LSI, a technique in which wiring is mutually conducted between elements formed in a multi-layered structure with high density is very important. Conventionally, in order that electric connection be made between elements formed in a multi-layered structure and electrically isolated by an interlayer insulating film, and between wirings, and also between an element and a wiring, for example, a via hole structure in which electric connection is made for elements or wirings, which are formed in layers at upper and lower sides of an interlayer insulating film, with conductive materials being embedded in through holes formed in the interlayer insulating film, or connection structures as shown in FIGS. 8A to 8C, 9A and 9B are employed.

FIGS. 8A, 8B, and 8C show an example of a connection structure of two wirings, which extend in directions perpendicular to each other and are formed in a layered form via an interlayer insulating film 34. An end of a first wiring 30 provided as a lower layer and an end of a second wiring 32 provided as an upper layer are connected via a through hole.

This connection structure is obtained in such a manner as will be described below. First, as shown in FIG. 8B, the interlayer insulating film 34 is formed by a CVD method on the first wiring 30, and thereafter, a rectangular hole is formed in the interlayer insulating film 34 at the end of the first wiring 30 so as to become a through hole 16. As shown in FIG. 8C, an extension wiring 32 is formed on the interlayer insulating film 34 so as to cover the through hole 16.

FIGS. 9A and 9B show an example of a connection structure of a diffusion layer 35 provided in a substrate 20 and an extension wiring 11d. As illustrated in the plan view of FIG. 9A and in the cross-sectional view of FIG. 9B, a through hole 16 is provided in an interlayer insulating film 34b formed by a CVD method or the like on an entire surface of the substrate 20 in which the diffusion layer 35 forming semiconductor elements is formed, so as to expose the diffusion layer 35. An extension wiring 32b having a connection region 31 which covers the through hole 16, is provided on the interlayer insulating film 34b.

A through hole contact 18 (for example, see FIGS. 8A, 8B, 8C, 9A, and 9B), that is a portion in which electric connection is made between such elements, and between wirings, and also between an element and a wiring and is a bottom surface portion of the through hole, is formed in such a manner that electric current is apt to concentrate therein. In order to obtain a semiconductor device having higher reliability than a conventional one, it is important to prevent increase of current density due to concentration of electric current in the through hole contact. For this reason, it becomes important to use materials having a low resistance and good ohmic properties in a region of the through hole contact or to provide a structure in which no local concentration of electric current occur.

Accordingly, there has conventionally been proposed a method in which an area of the through hole contact is increased by increasing a transverse dimension of a wiring disposed as a lower layer or by increasing the size of a through hole, so as to reduce current density. For example, in a case of Emitter-Coupled Logic (ECL) circuit, electric current flows between the lower-side wiring and the upper-side wiring via the through hole contact in a unit from several tens of mA to several hundreds of mA. Therefore, the transverse dimension of the wiring and the size of the through hole are each made relatively larger to become several tens of $\mu$m to several hundreds of $\mu$m so that an allowable current density becomes about $1 \times 30^5$ (A/cm$^2$) or less.

However, in a conventional multi-layered wiring structure having a through hole contact, there exists a problem in which local concentration of electric current is caused and so-called electromigration such as void or hillock thereby occurs.

For example, in the structure in which the first wiring 30 at the lower side and the second wiring 32 at the upper-side are connected together so as to be made perpendicular to each other as shown in the plan view of FIG. 8A, in a case in which electric current flows from the first wiring 30 to the second wiring 32, assuming that the length of each side of the through hole contact 18 is indicated by "l", a distance between an end of the second wiring 32 to one side of the through hole contact 18 is indicated by "m", a distance between an end of the first wiring 30 to one side of the through hole contact 18 is indicated by "n", positions on the first wiring 30 at which straight lines drawn from corners of the through hole contact 18 perpendicular to a side of the second wiring 32 cross the side of the second wiring 32 are indicated by "$A_1$" and "$A_3$", a position at a midpoint of positions $A_1$ and $A_3$ on the first wiring 30 is indicated by "$A_2$", and a position on the second wiring 32 where a straight line drawn from a corner of the through hole contact 18 nearest the above-described positions $A_1$, $A_2$, and $A_3$ perpendicular to a side of the first wiring 30 crosses the side of the first wiring 30 is indicated by "B", a length of a shortest path of current flowing from each position $A_1$, $A_2$, and $A_3$ to the second wiring 32 can be expressed artificially as described below.

$$|A_1B| = m + n + 1 \quad (1)$$

$$|A_2B| = m + n + (1/2)1 \quad (2)$$

$$|A_3B| = m + n \quad (3)$$

wherein, $|A_1B|$ indicates a length of a shortest path between point $A_1$, and point B, $|A_2B|$ indicates a length of a shortest path between point $A_2$ and point B, and $|A_3B|$ indicates a length of a shortest path between point $A_3$ and point B.

The relation $|A_1B| > |A_1B| > |A_1B|$ is given by the above-described expressions (1), (2), and (3), and therefore, the path indicated by $A_3B$ is the shortest. Accordingly, it is considered that electric current concentrates in one corner of the through hole contact 18 on the path of $A_3B$.

If current concentrates, void or hillock may be generated at a high frequency, and there is a high possibility that after a fixed period of time has elapsed, electromigration may occur to cause improper wiring. Particularly, as shown in FIG. 8C, in a case of a wiring structure including a through hole, a layer thickness of a wiring in a region which covers a side surface portion of the through hole is small, and therefore, there is also a possibility that a thin layer portion of the wiring is molten and broken by occurrence of electromigration or generation of heat due to concentration of current.

Further, in a case of the structure shown in FIGS. 9A and 9B, current is apt to concentrate in a side surface portion of the through hole disposed perpendicular to a direction in which current flows. In this case as well, the layer thickness of a wiring in a region which covers the side surface portion of the through hole is small, and therefore, there is a possibility that a thin layer portion may be molten and broken due to occurrence of electromigration or generation of heat.

SUMMARY OF THE INVENTION

In view of the above-described circumstances, it is an object of the present invention to provide a connection structure in which concentration of current is prevented in a portion in which wirings, or an element and a wiring are connected.

In order to achieve the above-described object, in accordance with a first aspect of the present invention, there is provided a connection structure in which two conductive members formed at upper and lower sides of an insulating film are electrically connected with each other, wherein a path changing portion is formed in a vicinity of a connecting portion of the two conductive members and changes a path of a portion of current flowing in the conductive members to disperse a current path.

In the first aspect of the present invention, a current path is dispersed due to a portion of the current path being changed by the path changing portion, and therefore, concentration of current in a region in which current is apt to concentrate from a structural point of view is prevented. As a result, occurrence of electromigration such as void or hillock, which is caused by concentration of current, or melting and breakage of wiring can be prevented. "The two conductive members formed at upper and lower sides of the insulating film" mentioned in the present invention includes not only wirings, but also includes any two members which need be electrically connected with each other, for example, an element and an extension wire.

In a second aspect of the present invention, the path changing portion is an insulating portion which prevents passing of a portion of current so as to keep away from a position in which a current path concentrates in the connecting portion of the two conductive members. An insulating material for forming the insulating portion is not particularly limited, but various known materials such as $SiO_2$ or air can be selected.

For example, when air is selected as the insulating material, a structure in which a slit is formed in the conductive member is provided. In this case, no cost for forming the path changing portion is required and the above-mentioned structure can be formed in a relatively simple process, which is preferable.

In order that the slit be formed in the conductive member, according to a third aspect of the present invention, when the two conductive members are disposed so as to extend in different directions, the path changing portion is comprised of at least one slit formed along a direction in which current flowing in at least one of the conductive members flows, and is provided in a vicinity of a position in an internal angle formed by the two conductive members.

In this structure, when a plurality of slits are formed, as the path changing portion, in one conductive member, so long as the plurality of slits are arranged in such a manner that intervals thereof are made larger as a distance from a position near an internal angle formed by two conductive members becomes longer, flow of current becomes more smooth as a distance from a position in which flow of current concentrates becomes longer, which is preferable.

In accordance with a fourth aspect of the present invention, when the two conductive members are disposed so as to extend in the same direction, the path changing portion is comprised of at least one slit formed to be inclined to a direction in which current flowing in a conductive member at an upstream side flows, and is provided in the conductive member at an upstream side in a vicinity of the connecting portion.

In the above-described structure, preferably, the slits may be disposed symmetrically with respect to a central axis of a conductive member at an upstream side so as to change a portion of current flowing in the conductive member at an upstream side from the direction of the central axis of the conductive member to the direction of an exterior side of the conductive member.

Further, according to a fifth aspect of the present invention, there is provided a connection structure in which two conductive members formed at upper and lower sides of an insulating film are electrically connected with each other, wherein a connecting portion of the two conductive members is formed such that flow of current becomes more smooth as a distance between the connecting portion and a position in which flow of current concentrates becomes longer.

Namely, the current path is changed and current is made to flow in a region in which current flows smoothly. Therefore, as described in the fifth aspect of the present invention, there is provided a structure in which current is hard to flow in a position in which flow of current concentrates, and flow of current becomes smooth in a position in which no concentration of current flow occurs. In this case, the current path is dispersed without being concentrated in one portion, and therefore, occurrence of electromigration such as void or hillock, which is caused by concentration of current, or melting and breakage of wiring can be prevented.

For example, current is hard to flow in a small-sized through hole and current flows smoothly in a large-sized through hole, and therefore, according to a sixth aspect of the present invention, the connecting portion is comprised of a plurality of through holes, and the plurality of through holes are disposed in such a manner that dimensions thereof becomes larger as a distance between a through hole and a position in which flow of current concentrates becomes longer.

A film thickness of a conductive member for covering a side surface portion of the through hole is made small, and therefore, a resistance of the conductive member for covering a side surface portion of the through hole becomes larger than that of other portion of the conductive member and current flows more smoothly in a portion having no through hole formed therein as compared with a portion having the through hole formed therein. Accordingly, in a seventh aspect of the present invention, the connecting portion is comprised of a plurality of through holes, and the plurality of through holes are disposed in such a manner that intervals of the through holes become larger as a distance between a through hole and a position in which flow of current concentrates becomes longer.

Further, in accordance with an eighth aspect of the present invention, there is provided a connection structure in which two conductive members formed at upper and lower sides of an insulating film are electrically connected with each other, wherein a connecting portion of the two conductive members is comprised of a through hole having a side surface which is inclined to a direction in which current flowing in a conductive member at an upstream side flows.

In other words, as described above, the film thickness of the conductive member for covering the side surface of the through hole is made smaller than that of other portion of the conductive member, and therefore, a density of current flowing through the side surface portion increases and concentration of current occurs at a high probability. In the eighth aspect of the present invention, the side surface of the through hole is inclined to a direction in which current flowing in the conductive member at an upstream side flows, and therefore, current is received by a large area as compared with a case in which the side surface of the through hole is made perpendicular to the direction in which current flows. When current flows through the side surface portion, the current density increases. As a result, occurrence of electromigration such as void or hillock, which is caused by concentration of current, or melting and breakage of wiring can be prevented.

Moreover, according to a ninth aspect of the present invention, there is provided a connection structure in which two conductive members formed at upper and lower sides of an insulating film are electrically connected with each other, wherein a connecting portion of the two conductive members is comprised of a through hole which is formed so as to expose at least upper and side surfaces of the conductive member formed at a lower side.

Namely, in the ninth aspect of the present invention, the through hole formed in the insulating film to allow connection between the upper conductive member and the lower conductive member is provided so as to expose not only an upper surface portion of the lower conductive member, but also expose at least two surfaces, that is, upper and side surfaces of the conductive member. For this reason, an area for the connection becomes larger, and even if concentration of current occurs when current flows through the connecting portion, current is received by a large area. As a result, there is no possibility of increase in current density, and occurrence of electromigration such as void or hillock, which is caused by concentration of current, or melting and breakage of wiring can be prevented.

DESCRIPTION OF THE PREFERRED EMBODIMENTS

Referring now to FIGS. 1 to 7, first to seventh embodiments of the present invention will hereinafter be described. In the first, third, sixth, and seventh embodiments, which will be described later, first wirings 10a to 10d (lower-side conductive members) each disposed as a lower layer are indicated by broken lines, and second wirings 12a to 12d (upper-side conductive members) each disposed as an upper-side are indicated by solid lines. Further, in the second, fourth, and fifth embodiments, which will be described later, diffusion layers 15a to 15c (lower-side conductive members) which are each a portion of elements formed as a lower layer are indicated by broken lines, and extension wires 11a to 11c (upper-side conductive members) each formed as an upper layer are indicated by solid lines.

[First Embodiment]

Figure 1:
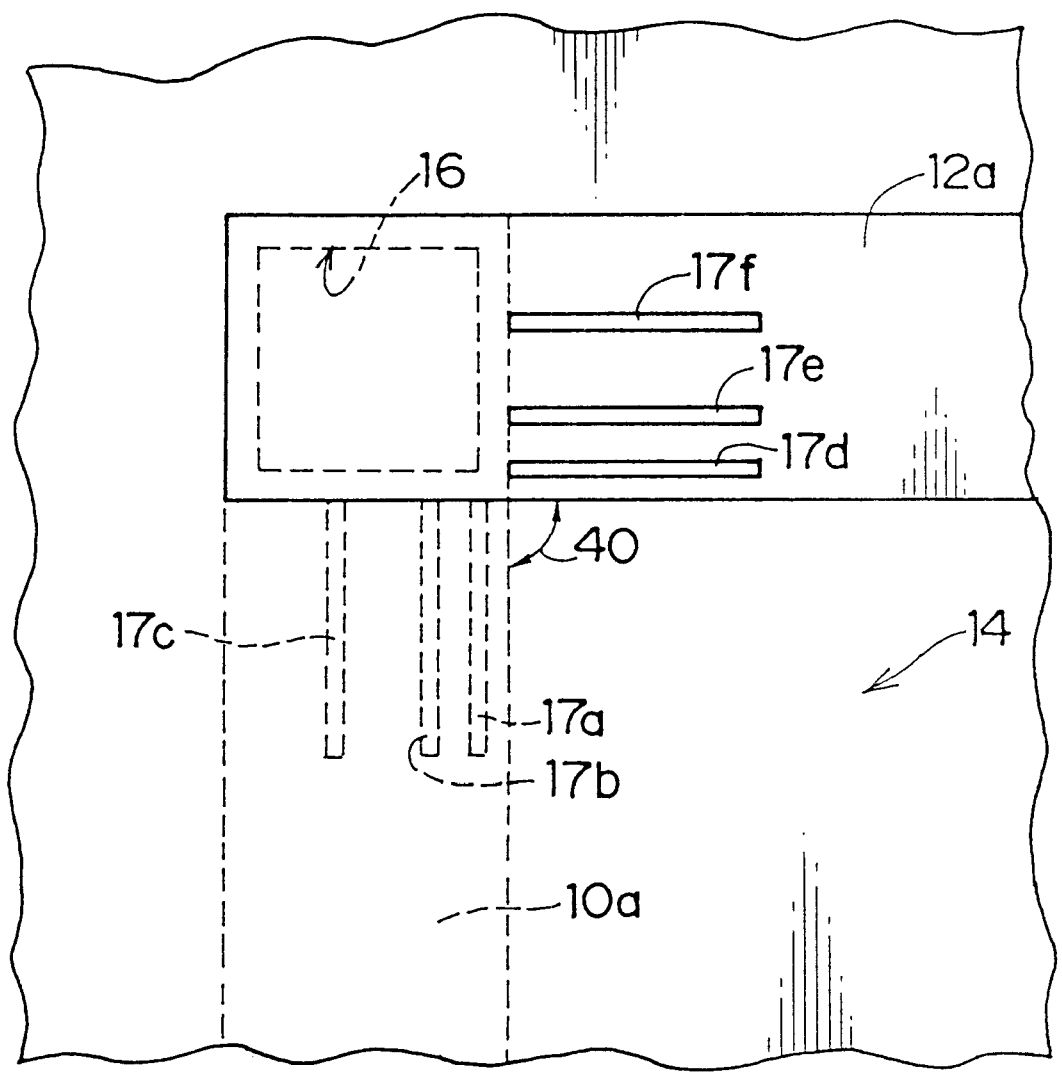
FIG. 1 is a plan view showing a first embodiment of a connection structure according to the present invention.

In the first embodiment of the present invention, as illustrated in FIG. 1, a connection structure is provided in which a first wiring 10a, an interlayer insulating film 14, and a second wiring 12a extending in a direction perpendicular to a direction in which the first wiring 10a extends are formed in layers in that order, and a through hole 16 is formed in the interlayer insulating film 14 by which these wirings 10a and 12a are electrically insulated from each other, so as to allow electric connection between these wirings 10a and 12a. In this connection structure, slits 17a to 17f by which a flow passage of current flowing from the first wiring 10a to the second wiring 12a is changed, are formed.

Namely, when the first wiring 10a is connected to the second wiring 12a extending in the direction perpendicular to a direction in which the first wiring 10a extends, concentration of current occurs in a region of a cross internal angle 40 formed by the wirings 10a and 12a. In the first embodiment, each three slits 17a to 17c and 17d to 17f are formed in the wirings 10a and 12a in such a manner that configuration intervals thereof gradually become larger from the side of the cross internal angle 40 of the wirings 10a and 12a. As a result, a portion of the flow passage of current is changed by the slits 17a to 17f.

For example, if the transverse dimension of each wiring is 100 $\mu$m, the width of each of the slits 17a to 17c and 17d to 17f is approximately in a range from 5 to 10 $\mu$m. This slit width can be properly adjusted in accordance with the transverse dimension or the quality of materials of a wiring in which slits are formed, the magnitude of current flowing through a wiring, and the like. If the slit width is less than or equal to 1 $\mu$m, a function for dispersing a current path is not sufficiently accomplished. Further, if the slit width is greater than or equal to 20 $\mu$m, electric current is hard to flow in the wiring. Both cases are not preferable.

Three slits are provided in each of the wirings 10a and 12a of the first embodiment. The first slits 17a and 17d of the wirings are each formed at a position which is about 5 to 8 $\mu$m apart from an end of the wiring at the side of the cross internal angle 40, the second slits 17b and 17e are respectively formed at positions which are about 9 to 12 $\mu$m apart from the first slits 17a and 17d, and the third slits 17c and 17f are respectively formed at positions which are about 20 to 30 μm apart from the second slits 17b and 17e.

The configuration intervals of these slits are set so as to satisfy the following relational expression (4). In a case in which the number of slits is n (n is a natural number), a distance between (k−1)-th slit (k is an arbitrary natural number smaller than or equal to n) and k-th slit is indicated by L(k−1, k).

$$L(k-1, k) < L(k, k+1) \quad (4)$$

It suffices that the slits be provided based on the configuration which satisfies the above-described relational expression (4), but it is preferable that dimension L(k, k+1) be set so as to satisfy the following expression (5).

$$L(k, k+1) = L(k-1, k) + \alpha \times k \quad (5)$$

wherein, α is a dimension of alignment allowance in a photolithographic process.

Further, length L(0, 1) between one end of a wiring pattern and the first slit is a predetermined value which is α or greater, and length L(n, n+1) between n-th slit and another end of the wiring pattern is also a predetermined value which is α or greater. In a case in which the relation L(n, n+1)<L(n−1, n) is given, the n-th slit is not provided.

In the first embodiment of the present invention, the structure as described above is provided, and therefore, electric current which can flow through the cross internal angle 40 can be restricted, thereby causing no concentration of current. As a result, electromigration such as void or hillock caused by increase in current density, or melting and breakage of wiring can be prevented.

The present invention is not limited to the first embodiment. For example, a plurality of minute slits formed at regular intervals may be provided only in a region in which current concentrates, or a plurality of slits may be provided in such a manner that each width of slits formed in a region in which current concentrates is made larger and each width of slits formed in a region in which concentration of current is not apt to occur is made smaller. Alternatively, only one slit may be provided in a region in which current concentrates.

[Second Embodiment]

Figure 2:
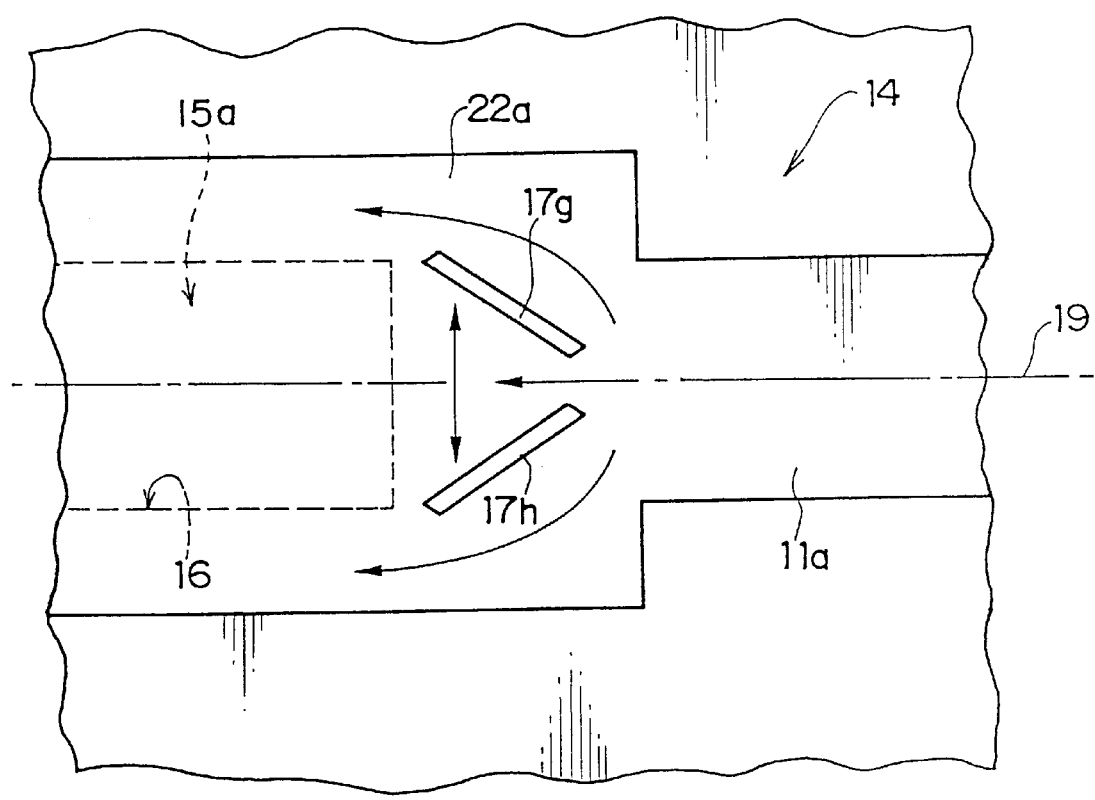
FIG. 2 is a plan view showing a second embodiment of a connection structure according to the present invention.

In a second embodiment of the present invention, as illustrated in FIG. 2, the interlayer insulating film 14 is formed on an entire surface of a substrate (not shown) in which a diffusion layer 15a which forms a semiconductor element is formed, and the through hole 16 is formed in the interlayer insulating film 14 so as to expose the diffusion layer 15a. Subsequently, an extension wiring 11a is formed in such a manner that a connection region 22a is disposed at an upper side of the interlayer insulating film 14 to cover the through hole 16, and two slits 17g and 17h are formed in the extension wire 11a so as to be inclined to a direction in which current flows.

For example, in a case in which the transverse dimension of the wiring is 100 μm, the transverse dimension of the connection region is 180 μm, and the transverse dimension of the diffusion layer 15a is 100 μm, two slits 17g and 17h are each formed in the shape of a rectangle whose transverse dimension is 5 to 20 μm (preferably, 10 μm or thereabouts) and whose longitudinal dimension is 40 to 80 μm (preferably, 60 μm or thereabouts) and are disposed symmetrical with respect to a center axis 19 of the extension wiring 11a. If the slit width is 1 μm or less, a function for diffusing a current path is sufficiently accomplished. Further, if the slit width is 30 μm or greater, current is hard to pass through the wiring. Both cases are not preferable.

Respective one ends of the slits 17g and 17h are each formed at a position which is 5 to 15 μm (preferably, 10 μm or thereabouts) apart from the center axis 19 of the extension wiring 11a so as to be disposed nearest to the center axis 19, and respective another ends of the slits 17g and 17h are each formed at a position which is 30 to 50 μm (preferably, 40 μm or thereabouts) apart from ends of the connection region 22a. The slits 17g and 17h are disposed so as to be inclined to the center axis 19 of the extension wiring 11a.

If the one ends of the slits 17g and 17h are each disposed at a position which is a distance shorter than 1 μm apart from the center axis 19 of the extension wiring 11a, the quantity of current flowing in the central portion of the wiring is exceedingly reduced, which is not preferable. Further, if the another ends of the slits 17g and 17h are each disposed at a position which is a distance shorter than about 2 μm apart from the end of the connection region 22a, no allowance of alignment dimensions in a photolithographic process is obtained and a possibility of the slit being broken at the end of the connection region 22a may arise, which is also not preferable.

Due to the above-described structure, a portion of a flow passage of current flowing through the extension wiring 11a is changed from a direction along the center axis 19 of the extension wiring 11a to a direction of an outer edge of the extension wiring 11a, and flows around the through hole 16 in the connection region 22a which is connected via the through hole 16 to the diffusion layer 15a. As a result, no concentration of current occurs. Namely, electric current flowing to reach a side surface portion of the through hole, which is directed perpendicular to a direction in which current flows in the extension wire 11a, is restricted by the two slits 17g and 17h, and the current path is diffused so as to become uniform. Accordingly, occurrence of electromigration such as void or hillock, which is caused by increase in current density, or melting and breakage of the wiring can be prevented.

[Third Embodiment]

Figure 3:
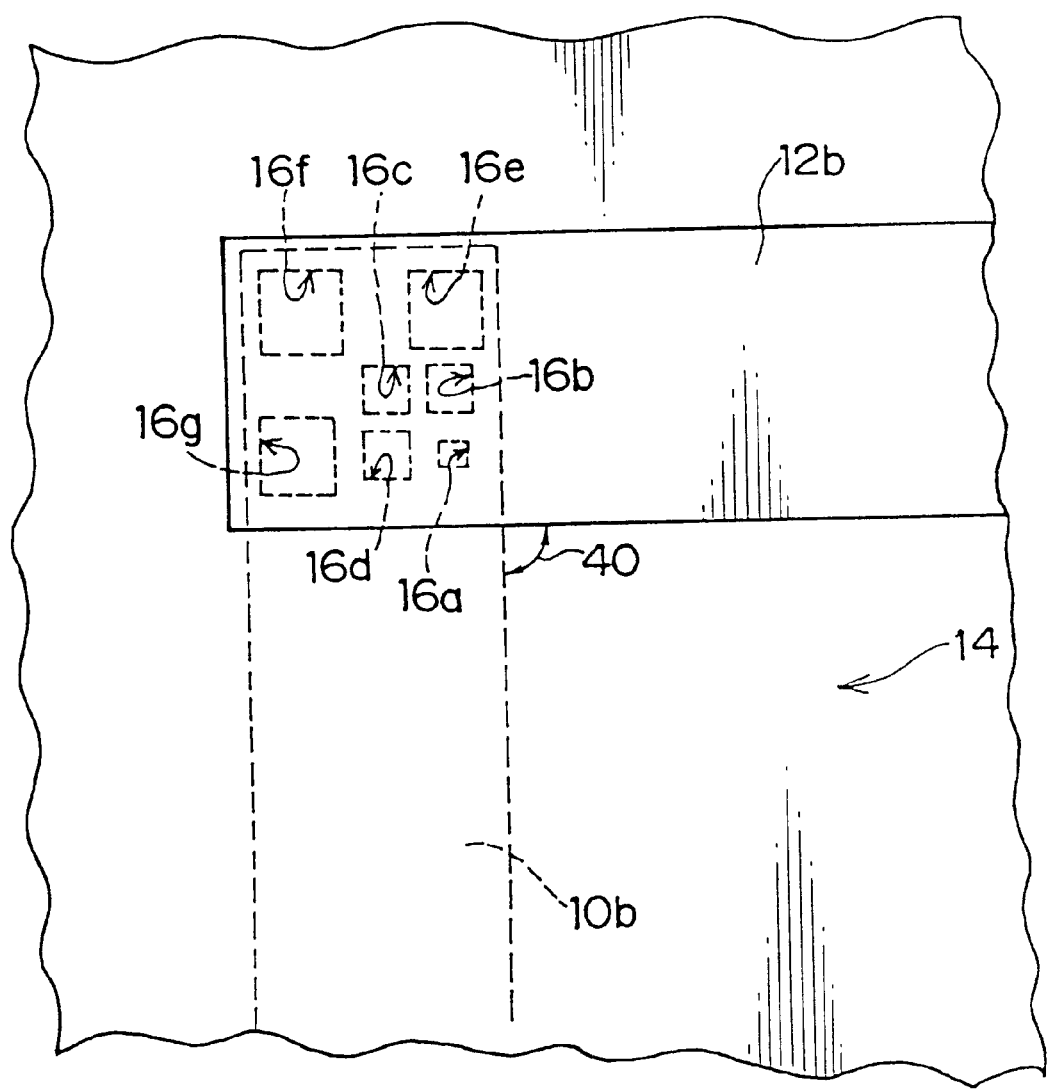
FIG. 3 is a plan view showing a third embodiment of a connection structure according to the present invention.

In a third embodiment of the present invention, as illustrated in FIG. 3, a first wiring 10b, the interlayer insulating film 14, and a second wiring 12b extending in a direction perpendicular to a direction in which the first wiring 10b extends are formed in layers in that order, and a plurality of through holes 16a to 16g are formed in the interlayer insulating film 14 by which the wirings 10b and 12b are electrically insulated from each other, and further, the wirings 10b and 12b are electrically connected with each other via the plurality of through holes 16a to 16g.

In the third embodiment of the present invention, dimensions of each of the plurality of through holes 16a to 16g formed in the interlayer insulating film 14 are determined in accordance with a position in which the through hole is formed. Namely, the respective dimensions of the through holes are determined so as to gradually become larger from the side near the cross internal angle 40 of the wirings 10b and 12b to the side at the longest distance from the cross internal angle 40.

In the third embodiment, a case in which the transverse dimension of each wiring is 100 μm will be described as an example. A first through hole 16a disposed at a position nearest to the cross internal angle 40 of the wirings 10b and 12b is formed into a rectangle of about 10 μm×10 μm and the dimensions thereof are made minimum. Second, third, and fourth through holes 16b, 16c, and 16d disposed at positions secondly nearest to the cross internal angle 40 and surrounding two sides of the first through hole 16a are each formed into a rectangle of about 20 μm×20 μm. These through holes 16b, 16c, and 16d are each made into the secondly minimum size. Further, through holes 16e, 16f, and 16g disposed at the longest distance from the cross internal angle 40 and surrounding the second to fourth through holes 16b to 16d are each formed into a rectangle of about 30 $\mu$m×30 $\mu$m, and these through holes 16e, 16f, and 16g are each made into the maximum size.

These through holes 16a to 16g are each formed into a square having four equal sides, and therefore, each have one intersecting point of diagonal lines. The configuration of the intersecting points of diagonal lines of the through holes 16a to 16g is determined in such a manner as described below.

First, the intersecting point of diagonal lines of the through hole 16a is disposed on an extension line of a straight line, which connects the intersecting point of diagonal lines of the through hole 16b and the intersecting point of diagonal lines of the through hole 16e, along the direction in which the first wiring 10b extends. Further, the intersecting point of diagonal lines of the through hole 16a is also disposed on an extension line of a straight line, which connects the intersecting point of diagonal lines of the through hole 16d and the intersecting point of diagonal lines of the through hole 16g, along the direction in which the second wiring 12b extends.

The intersecting point of diagonal lines of the through hole 16c is disposed at an intersecting point of a straight line passing through the intersecting point of diagonal lines of the through hole 16d along the direction in which the first wiring 10b extends, and a straight line passing through the intersecting point of diagonal lines of the through hole 16b along the direction in which the second wiring 12b extends.

Further, the intersecting point of diagonal lines of the through hole 16f is disposed at an intersecting point of a straight line passing through the intersecting point of diagonal lines of the through hole 16g along the direction in which the first wiring 10b extends, and a straight line passing through the intersecting point of diagonal lines of the through hole 16e along the direction in which the second wiring 12b extends.

An interval between the through hole 16a and the through hole 16b, an interval between the through hole 16b and the through hole 16e, an interval between the through hole 16a and the through hole 16d, and an interval between the through hole 16d and the through hole 16g are each set in the range from about 5 to 10 $\mu$m so as to prevent concentration of current.

If a distance between any adjacent through holes is 1 $\mu$m or less, concentration of current flowing between the through holes occurs and current density becomes higher, which is not preferable. If the distance is 20 $\mu$m or more, concentration of current at the side of the cross internal angle 40 cannot be prevented, which is also not preferable.

As a result, a resistance value per a predetermined area increases in the vicinity of the cross internal angle 40 and current is hard to flow therein. On the other hand, a resistance value per a predetermined area decreases as a distance from the cross internal angle 40 becomes greater, and flow of current becomes smooth. Accordingly, the current path is diffused without being concentrated in the vicinity of the cross internal angle 40. As a result, occurrence of electromigration such as void or hillock, which is caused by concentration of current, or melting and breakage of wiring can be prevented.

[Fourth Embodiment]

Figure 4:
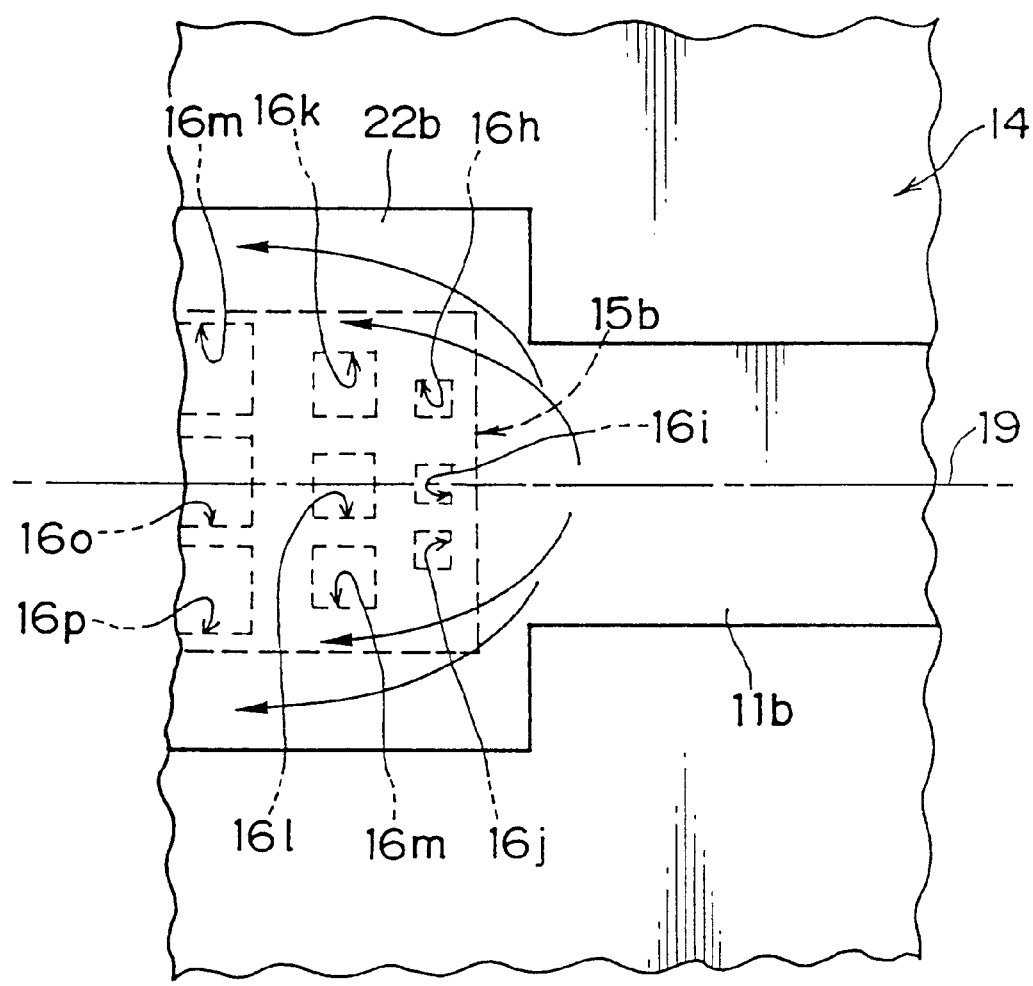
FIG. 4 is a plan view showing a fourth embodiment of a connection structure according to the present invention.

In a fourth embodiment of the present invention, as illustrated in FIG. 4, the interlayer insulating film 14 is formed on the entire surface of a substrate (not shown) in which a diffusion layer 15b forming a semiconductor element is formed, and a plurality of through holes 16h to 16p (only nine through holes are shown in FIG. 4), which are disposed such that three through holes are provided in each row, are formed in the interlayer insulating film 14 so as to expose the diffusion layer 15b. A connection region 22b of an extension wiring 11b is formed on the interlayer insulating film 14 to cover the plurality of through holes 16h to 16p, thereby allowing electric connection between the diffusion layer 15b and the extension wiring 11b.

In the same way as in the above-described third embodiment, dimensions of each of the plurality of through holes 16h to 16p are determined in accordance with a position at which the through hole is formed. Namely, the respective dimensions of the through holes are determined so as to become larger as a distance from a position at which current first flows into the diffusion layer 15b from the connection region 22b in which concentration of current is apt to occur becomes greater.

In the fourth embodiment of the present invention, a case in which the transverse dimension of the diffusion layer 15b is 100 $\mu$m will be described as an example. First, second, and third through holes 16h, 16i, and 16j disposed at positions nearest to the position in which current first flows and arranged in one row at intervals of 10 $\mu$m are each formed into a rectangle of about 10 $\mu$m×10 $\mu$m and the dimensions thereof are each made minimum.

Fourth, fifth, and sixth through holes 16k, 16l, and 16m disposed at positions secondly nearest to the position in which current first flows and arranged in one row at a downstream side of the first to third through holes 16h to 16j are each formed into a rectangle of about 15 $\mu$m×15 $\mu$m. The fourth to sixth through holes are each made into the secondly minimum size.

Further, seventh, eighth, and ninth through holes 16n, 16o, and 16p disposed at positions thirdly nearest to the position in which current first flows and arranged in one row at a downstream side of the fourth to sixth through holes 16k to 16m are each formed into a rectangle of about 20 $\mu$m×20 $\mu$m and the dimensions thereof are each made into the thirdly minimum. Although not illustrated, in the fourth embodiment, through holes subsequent to those of the third row are also formed in rows over a region corresponding to the diffusion layer 15b.

In the fourth embodiment, intervals between adjacent through holes are all the same and the through holes are provided at intervals of about 5 to 10 $\mu$m. If the interval between through holes is 1 $\mu$m or less, current flowing between the through holes concentrates and current density becomes higher, which is not preferable. Further, if the interval is 20 $\mu$m or more, concentration of current at the side of the cross internal angle 40 cannot be prevented, which is also not preferable.

Due to the above-described structure, a resistance value per a predetermined area increases at the position in which current first flows from the connection region 22b into the diffusion layer 15b, and current is hard to flow therein. On the other hand, a resistance value per a predetermined area decreases as the distance from the position in which current first flows from the connection region 22b into the diffusion layer 15b becomes greater, and flow of current becomes smooth. Accordingly, the current path is diffused without being concentrated in the vicinity of the above-described position. As a result, occurrence of electromigration such as void or hillock, caused by increase of current density, or melting and breakage of wiring can be prevented.

[Fifth Embodiment]

Figure 5:
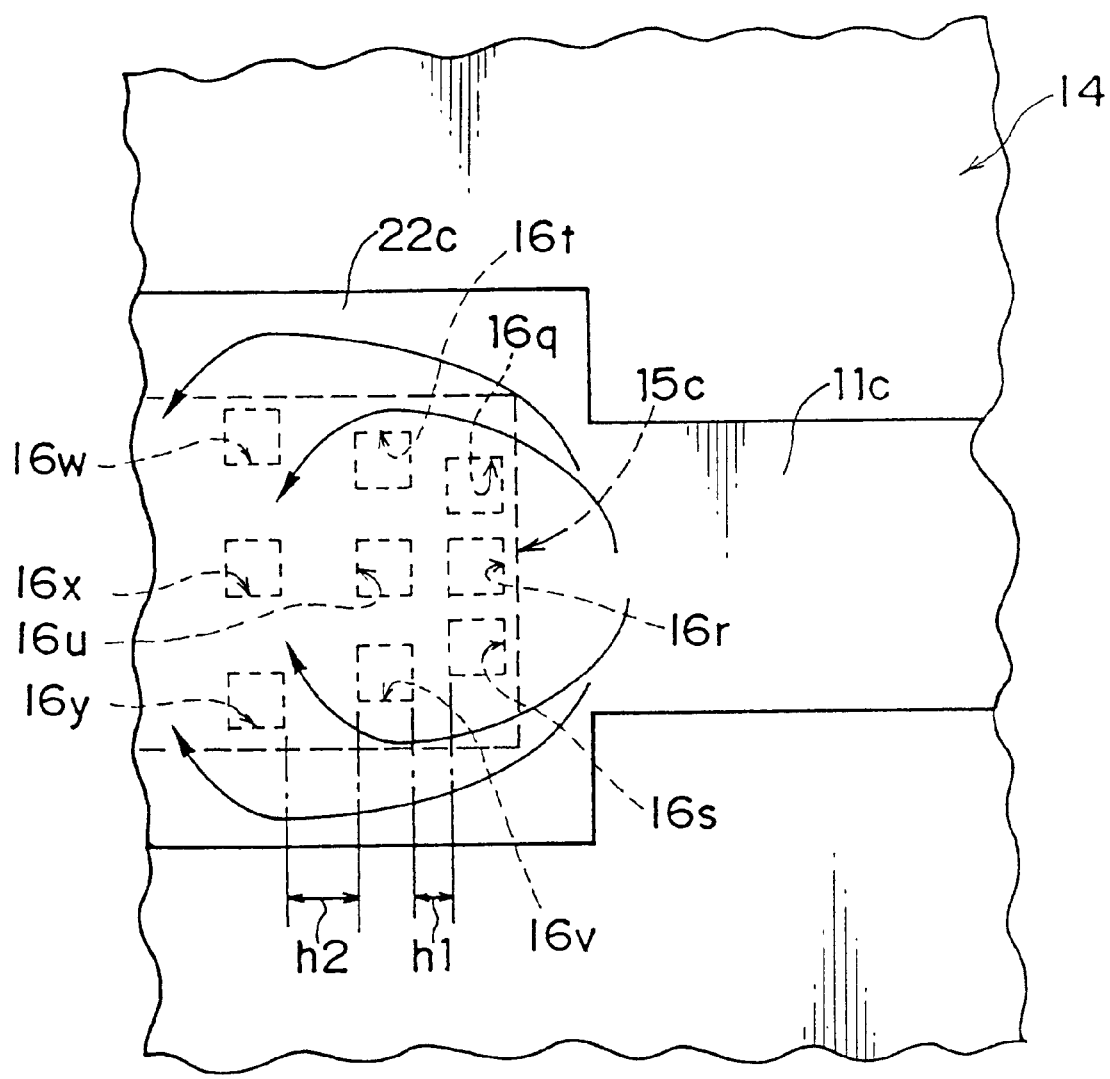
FIG. 5 is a plan view showing a fifth embodiment of a connection structure according to the present invention.

In a fifth embodiment of the present invention, as illustrated in FIG. 5, the interlayer insulating film 14 is formed on the entire surface of a substrate (not shown) in which a diffusion layer 15c forming a semiconductor element is formed, and a plurality of through holes 16q to 16y (only nine through holes are shown in FIG. 5), which are disposed such that three through holes are provided in each row, are formed in the interlayer insulating film 14 so as to expose the diffusion layer 15c. A connection region 22c of an extension wiring 11c is formed on the interlayer insulating film 14 to cover the plurality of through holes 16q to 16y, thereby allowing electric connection between the diffusion layer 15c and the extension wiring 11c.

In the fifth embodiment, a case in which the transverse dimension of the diffusion layer 15c is 120 μm will be described as an example. The plurality of through holes 16q to 16y which are each formed into a rectangle of about 20 μm×20 μm are arranged by three for each row so that intervals h1 and h2 of the rows becomes larger as a distance from a position in which current first flows into the diffusion layer 15c from the connection region 22c in which concentration of current is apt to occur becomes greater, i.e., so that the relation h1<h2 is satisfied.

Namely, three through holes 16q, 16r, and 16s in the first row are each formed at a distance of about 5 to 10 μm from the position in which current first flows, and are arranged in one row at intervals of 10 μm. The through holes 16q and 16s located at both ends are each formed at a position which is about 20 μm apart from an end of the diffusion layer 15c near to the through hole. So long as the through holes 16q and 16s are each formed at a position which is at least 10 μm apart from the end of the diffusion layer 15c, current easily flows backward. For this reason, concentration of current can be prevented.

Three through holes 16t, 16u, and 16v in the second row are formed at a distance of about 10 to 15 μm apart from the first row of through holes 16q to 16s and are arranged in one row at intervals of 10 μm or thereabouts. The through holes 16t and 16v located at both ends are each formed at a position which is about 15 μm apart from an end of the diffusion layer 15c near to the through hole. So long as the through holes 16t and 16v are each formed at a position which is at least 10 μm apart from the end of the diffusion layer 15c, current flowing from the front side is made to flow into the diffusion layer 15c and further flow backward, which is preferable.

Further, three through holes 16w, 16x, and 16y in the third row are formed downstream at a distance of about 15 to 20 μm from the second row of through holes 16t to 16v and are arranged in one row at intervals of 20 μm or thereabouts. The through holes 16w and 16y located at both ends are each formed at a position which is about 10 μm apart from an end of the diffusion layer 15c near to the through hole.

If the through holes 16w and 16y are each formed at a position which is 2 μm or less apart from the end of the diffusion layer 15c, no allowance of alignment dimension in a photolithographic process is obtained, which is not preferable. Accordingly, these through holes are preferably each formed at a position which is at least 2 μm apart from the end of the diffusion layer 15c.

The intervals of the rows of through holes are set so as to satisfy the following relational expression (6). In a case in which the number of rows of through holes is m (m is a natural number), a distance between a through hole in (k−1)-th row (k is an arbitrary natural number less than or equal to m) and a through hole in k-th row is indicated as H(k−1, k).

$$H(k-1, k) < H(k, k+1) \quad (6)$$

A length H(0, 1) between a position at an end of the diffusion layer 15c into which current first flows, and the through holes in the first row is a predetermined length more than or equal to an allowance of alignment dimension in a photolithographic process, and a length H(m, m+1) between the through holes in m-th row and a position at another end of the diffusion layer 15c corresponding to the end of the diffusion layer 15c in which current first flows is also a predetermined length more than or equal to an allowance of alignment dimension in a photolithographic process. If length H(m, m+1) is smaller than the allowance of alignment dimension in the photolithographic process, through holes in the m-th row are not provided.

Due to the above-described structure, a resistance value per a predetermined area increases at the position in which current first flows from the connection region 22c into the diffusion layer 15c, and current is hard to flow therein. On the other hand, a resistance value per a predetermined area decreases as the distance from the position in which current first flows from the connection region 22c into the diffusion layer 15c becomes greater, and flow of current becomes smooth. Accordingly, the current path is diffused without being concentrated in the vicinity of the above-described position. As a result, occurrence of electromigration such as void or hillock, caused by increase of current density, or melting and breakage of wiring can be prevented.

Namely, the resistance value per a predetermined area in a region in which intervals of rows of through holes are made larger is smaller than that in a region in which intervals of rows of through holes are made smaller, which results in that current smoothly flows. Accordingly, due to the intervals of rows of through holes being adjusted, current is hard to flow in a region in which concentration of current is apt to occur, and current smoothly flows in a region in a which no concentration of current occur. As a result, a current path is diffused so as to become uniform, and occurrence of electromigration such as void or hillock, which is caused by increase in current density, or melting and breakage of wiring can be prevented.

In the structure provided by the fifth embodiment, it is not necessary that dimensions of a hole area of each through hole be exactly determined. Accordingly, no consideration for irregularities of dimensions of the hole area is required, and manufacturing efficiency is thereby excellent.

The number of through holes in each row or the configuration of through holes, which were explained in the fourth and fifth embodiments of the present invention, are not limited to the same. For example, the number of through holes in each row can be properly changed in accordance with dimensions of a through hole contact, dimensions of through holes, or the like in such a manner that four through holes are provided in the first row, three through holes are formed in the second row, and four through holes are formed in the third row.

[Sixth Embodiment]

Figure 6:
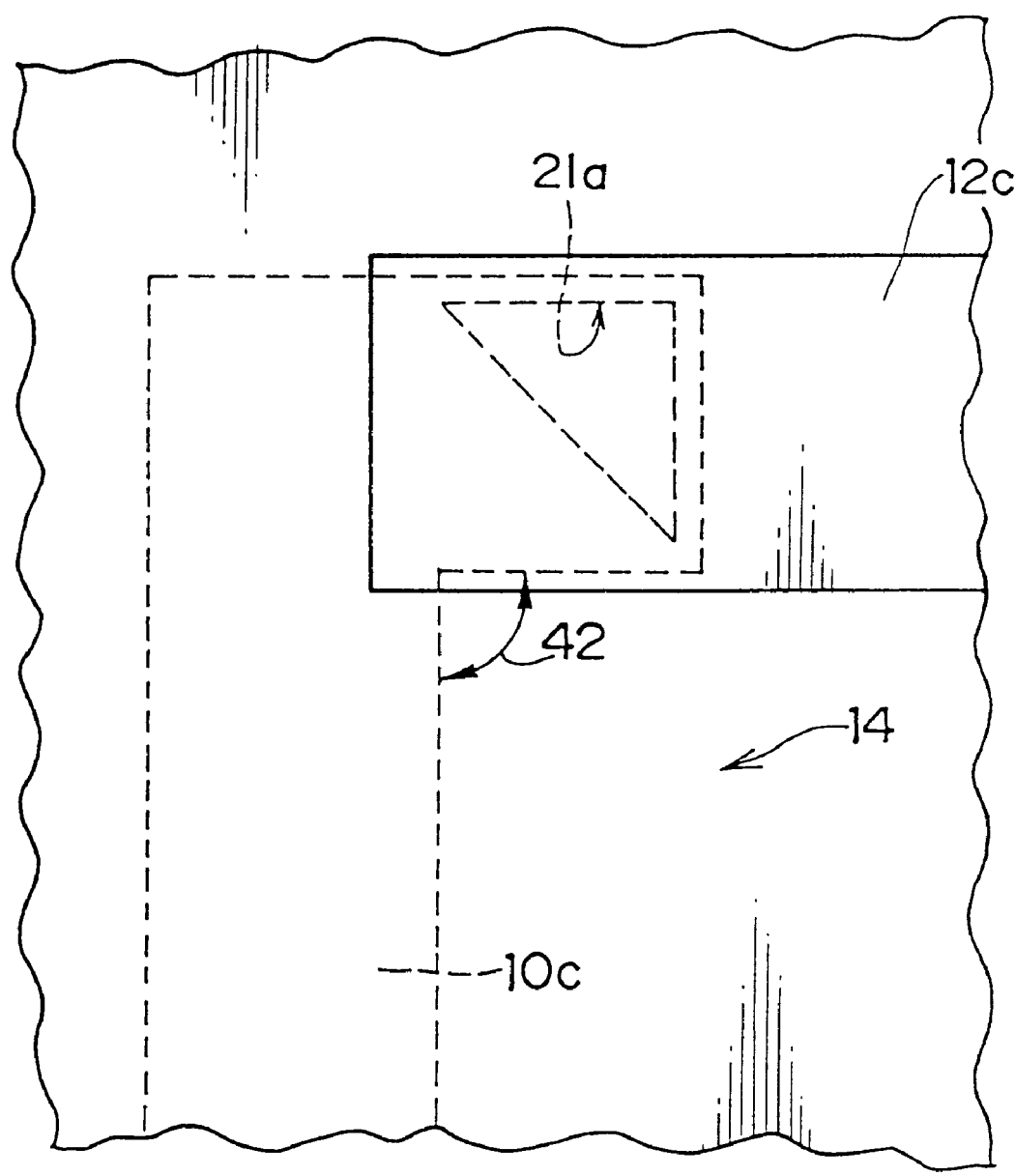
FIG. 6 is a plan view showing a sixth embodiment of a connection structure according to the present invention.

In a sixth embodiment of the present invention, as illustrated in FIG. 6, a first wiring 10c is formed in such a manner that an end thereof is bent in the shape of L, and thereafter, the interlayer insulating film 14 by which two wirings 10c and 12c are electrically insulated from each other is formed on the first wiring 10c. The second wiring 12c is formed on the interlayer insulting film 14 so as to extend in a direction perpendicular to a direction in which the first wiring 10c extends, with an end of the wiring 12c overlapping with the L-shaped bending end of the first wiring 10c.

A through hole 21a is provided in the interlayer insulating film 14 so as to allow electric connection between the two wirings 10c and 12c. The through hole 21a is formed into a triangular pole in such a manner that a side surface thereof is inclined to the center axis of the first wiring 10c.

Namely, concentration of current occurs at the side of an internal angle 42 of the bending portion of the first wiring 10c, and when current passes through the bending portion, current flows dispersedly. Therefore, in the sixth embodiment, the through hole which is a portion connected with the second wiring 12c is provided at a downstream side of the bending portion so that the side surface thereof is inclined to the center axis of the first wiring 10c, and current passing through the bending portion and flowing dispersedly is received by the side surface of the through hole 21a having a relatively large area.

As a result, current density per a predetermined area of current flowing into the through hole 21a is made smaller, and therefore, occurrence of electromigration such as void or hillock, or melting and breakage of wiring can be prevented.

It suffices that the shape of a hole area of the through hole 21a be formed, for example, into a parallelogram so as to have one side inclined to the center axis of a wiring disposed at an upstream side, and the shape of a hole area of the through hole 21a is not limited to a triangular shape.

Due to the above-described structure, dimensions of the through hole can be increased without being restricted by design standards of a lower-side wiring, and therefore, the degree of freedom of an applicable process increases.

[Seventh Embodiment]

Figure 7A:
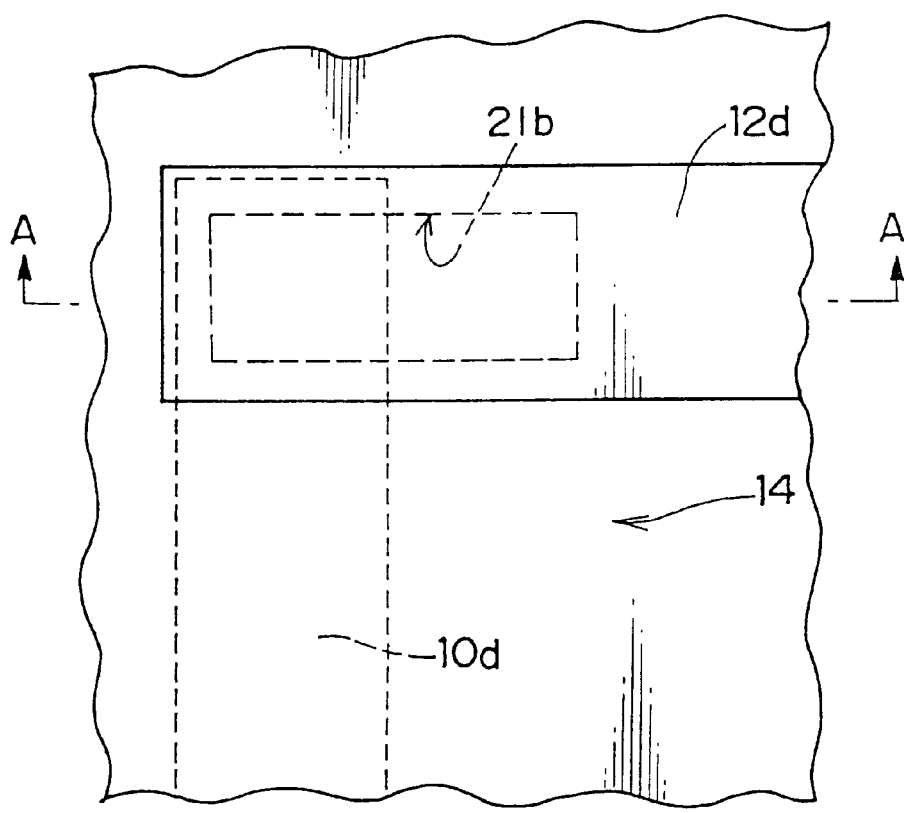
FIG. 7A is a plan view showing a seventh embodiment of a connection structure according to the present invention and FIG. 7B is a cross-sectional view taken along the line A—A in FIG. 7A.
Figure 7B:
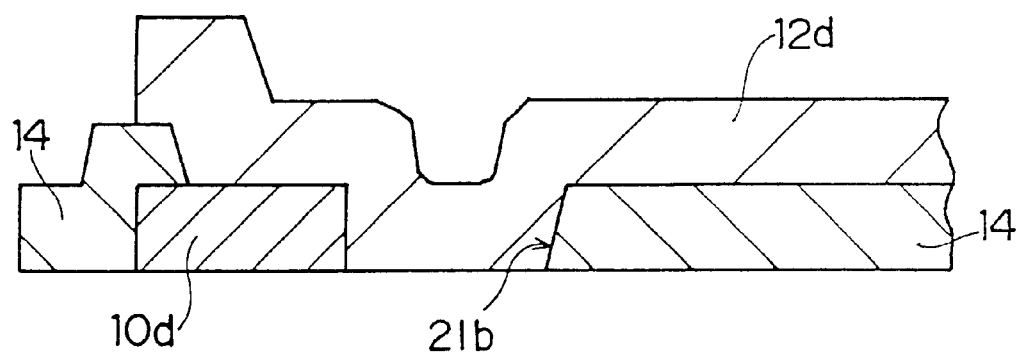
Figure 8A:
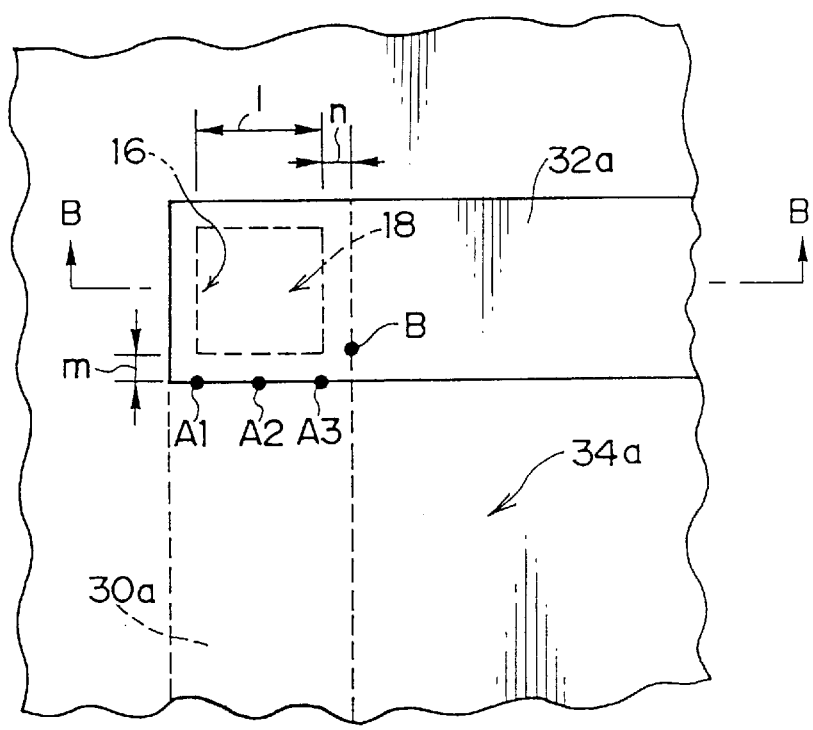
FIG. 8A is a plan view showing a conventional wiring-to-wiring connection structure.
Figure 8B:
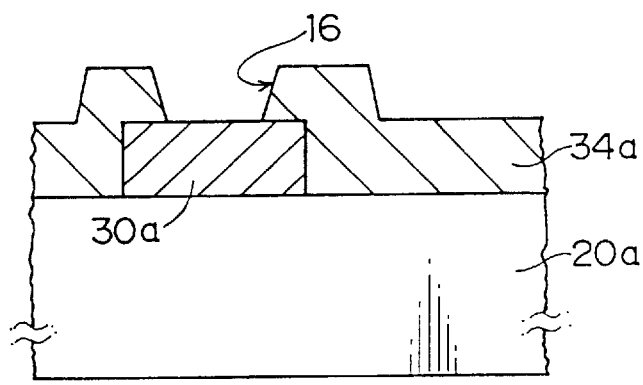
FIG. 8B is a cross-sectional view taken along the line B—B in FIG. 8A, showing a state prior to formation of a second wiring.
Figure 8C:
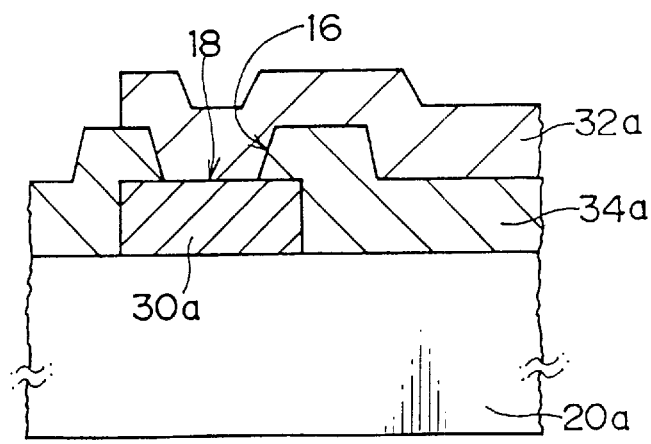
FIG. 8C is a cross-sectional view taken along the line B—B in FIG. 8A, showing a state after the second wiring has been formed.
Figure 9A:
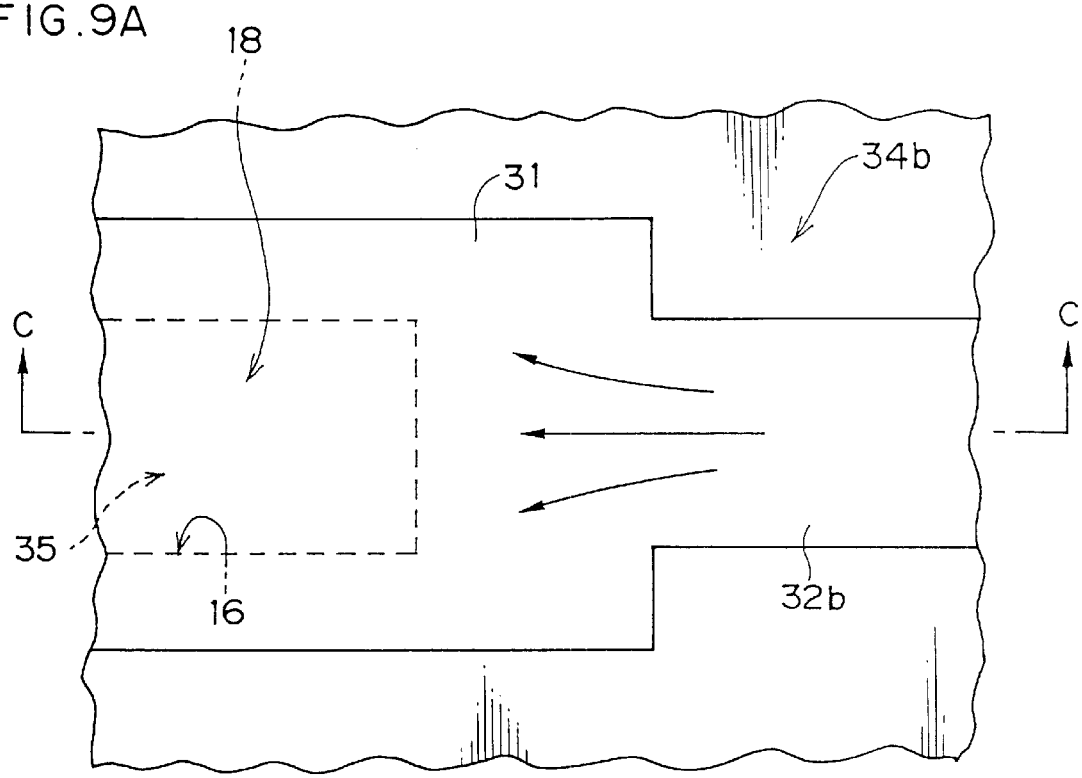
FIG. 9A is a plan view showing a conventional connection structure of a diffusion region and a wiring.
Figure 9B:
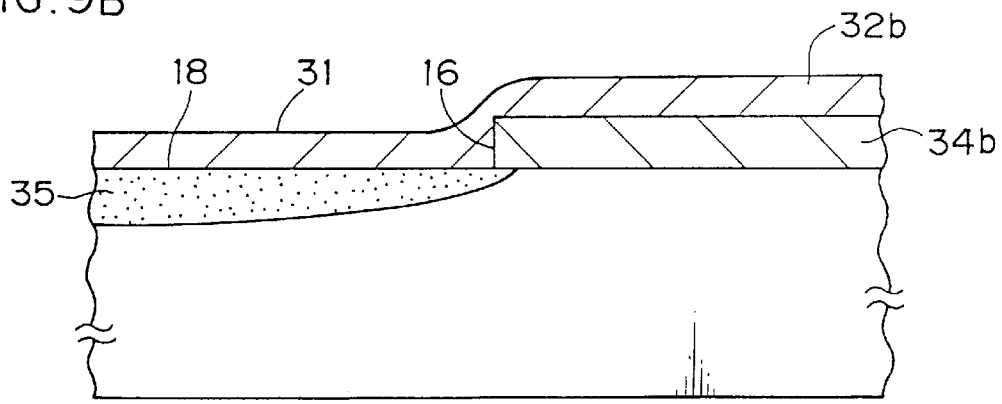
FIG. 9B is a cross-sectional view taken along the line C—C in FIG. 9A.

In a seventh embodiment of the present invention, as illustrated in FIG. 7, a connection structure is provided in which a first wiring 10d, the interlayer insulating film 14, and a second wiring 12d extending in a direction perpendicular to a direction in which the first wiring 10d extends are formed in layers in that order, and a through hole 21b is formed in the interlayer insulating film 14 by which the two wirings 10d and 12d are electrically insulated from each other, so as to allow electric connection between the two wirings 10d and 12d. In this connection structure, the dimensions of the through hole 21b formed in the interlayer insulating film 14 are set so that upper and side surfaces of the first wiring 10d are both exposed.

In other words, due to the through hole 21b being formed so as to extend in a direction in which the second wiring 12d extends, a contact area of the first wiring 10d and the second wiring 12d increases, and therefore, current density per a predetermined area becomes smaller. As a result, occurrence of electromigration or melting and breakage of wiring can be prevented. Additionally, one side surface of the through hole 21b is located apart from the first wiring 10d provided at a lower side. In this case, even if a layer thickness of the second wiring 12d in a region which covers this side surface of the through hole is made smaller, this region in which the layer thickness is smaller is separated from a region in which concentration of current occurs. Accordingly, occurrence of electromigration or melting and breakage of wiring in this region can be prevented.

Further, in the same manner as in the above-described sixth embodiment, the dimensions of the through hole can be increased without being restricted by design standards of a wiring disposed at a lower side, and therefore, the degree of freedom of an applicable process increases.

A method for forming the above-described connection structures provided by the first, third, sixth, and seventh embodiments will hereinafter be briefly described.

First, a silicon dioxide ($SiO_2$) film having a thickness of 100 to 200 nm is formed by a CVD method on an entire surface of a substrate with an element formed therein. Subsequently, a nitride film having a thickness of 10 to 50 nm is formed on the entire surface of the substrate with the silicon dioxide film formed thereon, and thereafter, an aluminum film having a thickness of 0.5 to 1.0 $\mu$m is formed by a sputtering method on the entire surface of the substrate.

Patterning of a wiring at a lower side is conducted by photolithography for the aluminum film thus obtained, and thereafter, etching is further conducted, thereby forming a lower wiring. Subsequently, a silicon dioxide film having the thickness of 100 to 200 nm and provided to become an interlayer insulating film is formed by a CVD method on the entire surface of the substrate.

Afterwards, a through hole contact pattern is formed so as to expose at least a portion of an upper surface of the lower wiring, and with at least a portion of the upper surface of the lower wiring being exposed, an aluminum film having a thickness of 0.5 to 1.0 $\mu$m is formed by a sputtering method on an entire surface of the substrate.

Patterning of a wiring at an upper side is conducted for the obtained aluminum film by photolithography, and thereafter, etching is further conducted, thereby forming an upper wiring. As a result, two wirings are formed in connection with each other.

The respective connection structures of the first, third, sixth, and seventh embodiments are obtained by changing the configuration of through hole contact pattern, and therefore, a description of each connection structure in these embodiments will be omitted.

Further, a method for forming the connection structures provided by the second, fourth, and fifth embodiments may merely be effected as in the above-described method except that the process of forming a lower wiring is replaced by a process of forming a diffusion layer in a substrate, and therefore, a description for each embodiment will be omitted.

The present invention is not limited to the connection structures provided by the first, third, sixth, and seventh embodiments in which directions in which the upper wiring and the lower wiring extend, and the configuration of the two wirings are characterized. For example, the present invention can also be applied to another structure in a case in which two wirings extend in different directions, that is, a so-called T-shaped cross structure in which one of the upper and lower wirings is connected at a position on another wire apart from ends thereof.

Further, in the second, fourth, and fifth embodiments as well, the present invention is not limited to the connection structure comprised of the above-described extension wiring and diffusion layer. For example, a structure in which electric connection is made by a polygonal through hole having a side surface inclined to a direction in which an extension wiring extends or having two side surfaces inclined to a center axis of the extension wiring at an upstream side is also applicable.

In the first, second, third, fourth, fifth, and seventh embodiments, slits and through holes are each formed into a rectangle. However, the present invention is not limited to the rectangular slits or through holes. Any other shape than the rectangle, such as circular or elliptical shape, can also be adopted so long as a function of the through hole provided by the present invention can be obtained.

As described above, according to the first to fourth aspects of the present invention, concentration of current in a region in which current is apt to concentrate from a structural point of view can be prevented, and therefore, electromigration such as void or hillock caused by concentration of current, or melting and breakage of wiring can be prevented.

Further, according to the fifth to seventh aspects of the present invention, a current path is dispersed and there is no possibility that a current density partially increase. Accordingly, electromigration such as void or hillock caused by concentration of current, or melting and breakage of wiring can be prevented.

Moreover, according to the eighth and ninth aspects of the present invention, current is received by a larger area as compared with a conventional structure, and therefore, electromigration such as void or hillock caused by concentration of current, or melting and breakage of wiring can be prevented.

What is claimed is:

1. A connection structure, comprising:
   a first conductive member formed on one side of an insulating film;
   a second conductive member formed on the other side of the insulating film, and having a connecting portion electrically connected to a connecting portion of the first conductive member; and
   a path changing means formed in at least one of the first and second conductive members, in proximity to the connecting portions of the first and second conductive members, for changing a path of a portion of current flowing in the first and second conductive members through their respective connecting portions.

2. A connection structure according to claim 1, wherein said path changing means is an insulating portion of the at least one the first and second conductive members that diverts flow of a portion of current away from a position at which current concentrates in the connecting portions of the first and second conductive members.

3. A connection structure according to claim 2, wherein when the first and second conductive members are disposed so as to extend in different directions, said insulating portion is comprised of at least one slit formed along a direction in which current flowing in the at least one of the first and second conductive members flows, and is formed proximate in position to an internal angle formed by the first and second conductive members.

4. A connection structure according to claim 2, wherein when the first and second conductive members are dispose so as to extend the in the same direction, said insulating portion is comprised of at least one slit formed to be inclined to a direction in which current flowing in the at least on of the first and second conductive members flows, and is formed in the at least one of the first and second conductive members at a position proximate to its connecting portion.

5. A connection structure, comprising:
   a first conductive member formed on one side of an insulating film; and
   a second conductive member formed on the other side of the insulating film, and having a connecting portion electrically connected to a connecting portion of the first conductive member;
   wherein the connecting portions of the first and second conductive members are connected by a plurality of through holes in the insulating film.

6. A connection structure according to claim 5, wherein the plurality of through holes are disposed in such a manner that size of each of the through holes becomes larger as a distance between such through hole and a position at which current concentrates in the connecting portions of the first and second conducting members becomes greater.

7. A connection structure according to claim 5, wherein the plurality of through holes are dispose of such a manner that intervals between each of the through holes become larger as a distance between such through hole and a position at which current concentrates in the connecting portions of the first and second conducting members becomes greater.

8. A connection structure, comprising:
   a first conductive member formed on one side of an insulating film; and
   a second conductive member formed on the other side of the insulating film, and having a connecting portion electrically connected to a connecting portion of the first conductive member;
   wherein the connecting portions of the first and second conductive members are connected by a through hole having a side surface that is inclined to a direction in which current flowing in one of the first and second conductive members flows.

9. A connection structure, comprising:
   a first conductive member formed on one side of an insulating film; and
   a second conductive member formed on the other side of the insulating film, and having a connecting portion electrically connected to a connecting portion of the first conductive member;
   wherein the connecting portions of the first and second conductive members are connected by a through hole in the insulating film which extends in the direction of the first conductive member beyond a side of the second conductive member so as to provide connection to at least a surface of the second conductive member on said side and a surface of the second conductive member in contact with the insulating film.

* * * * *